US007212076B1

United States Patent
Taheri et al.

(10) Patent No.: US 7,212,076 B1
(45) Date of Patent: May 1, 2007

(54) MIXED SIGNAL METHOD AND SYSTEM FOR TUNING A VOLTAGE CONTROLLED OSCILLATOR

(75) Inventors: Babak Taheri, San Francisco, CA (US); Gopal Patil, San Jose, CA (US)

(73) Assignee: Cypress Semiconductor Corpoartion, San Jose, CA (US)

( * ) Notice: Subject to any disclaimer, the term of this patent is extended or adjusted under 35 U.S.C. 154(b) by 14 days.

(21) Appl. No.: 10/943,611

(22) Filed: Sep. 17, 2004

(51) Int. Cl.
*H03B 5/08* (2006.01)
(52) U.S. Cl. .................. 331/177 V; 331/179
(58) Field of Classification Search .......... 331/16, 331/177 V, 179
See application file for complete search history.

(56) References Cited

U.S. PATENT DOCUMENTS 6,496,075 B2 * 12/2002 Justice et al. ............. 331/11
6,563,392 B2 * 5/2003 Gomez et al. ......... 331/117 FE
6,639,474 B2 * 10/2003 Asikainen et al. ........... 331/17
6,774,736 B1 * 8/2004 Kwek et al. ............ 331/177 V
2004/0189403 A1 * 9/2004 Suzuki et al. ............... 331/16
2004/0212439 A1 * 10/2004 Goddard ..................... 331/16

* cited by examiner

*Primary Examiner*—Joseph Chang
(74) *Attorney, Agent, or Firm*—Blakely, Sokoloff, Taylor & Zafman LLP (57) ABSTRACT

A mixed signal method and system for tuning a voltage controlled oscillator is described. The method includes dividing a frequency range of an oscillator circuit into a plurality of regions, digitally selecting and tuning one of the plurality of regions of the divided frequency range of the oscillator circuit, and further tuning the selected region of the frequency range of the oscillator circuit via one or more analog tuning elements.

16 Claims, 9 Drawing Sheets

MIXED SIGNAL METHOD AND SYSTEM FOR TUNING A VOLTAGE CONTROLLED OSCILLATOR

TECHNICAL FIELD

Embodiments of the invention relate to the field of circuits, and more specifically to a mixed signal method and system for tuning a voltage controlled oscillator.

BACKGROUND

Figure 1:
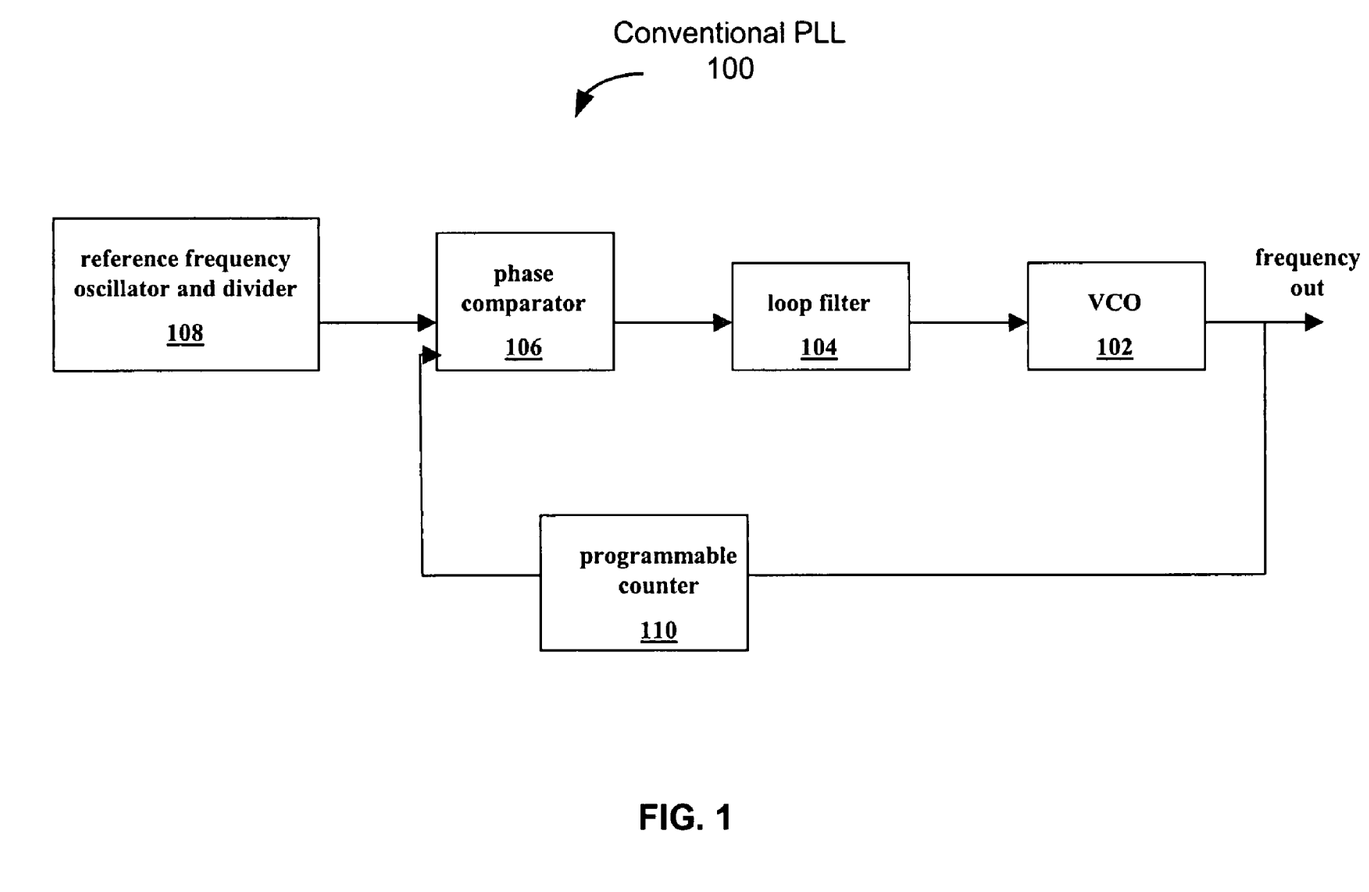
FIG. 1 is a block diagram illustrating a conventional phase lock loop.

Voltage controlled oscillators (VCOs) are used in various applications, including phase lock loops (PLLs). An example of a conventional PLL 100 that uses a VCO is shown in FIG. 1. The PLL 100 includes a VCO 102, a loop filter 104, a phase comparator 106, a reference frequency oscillator and divider 108, and a programmable counter 110. These components work together to lock onto the frequency of an input signal. In order to do so, the VCO is tuned to match in phase with the frequency of the input signal.

Figure 2A:
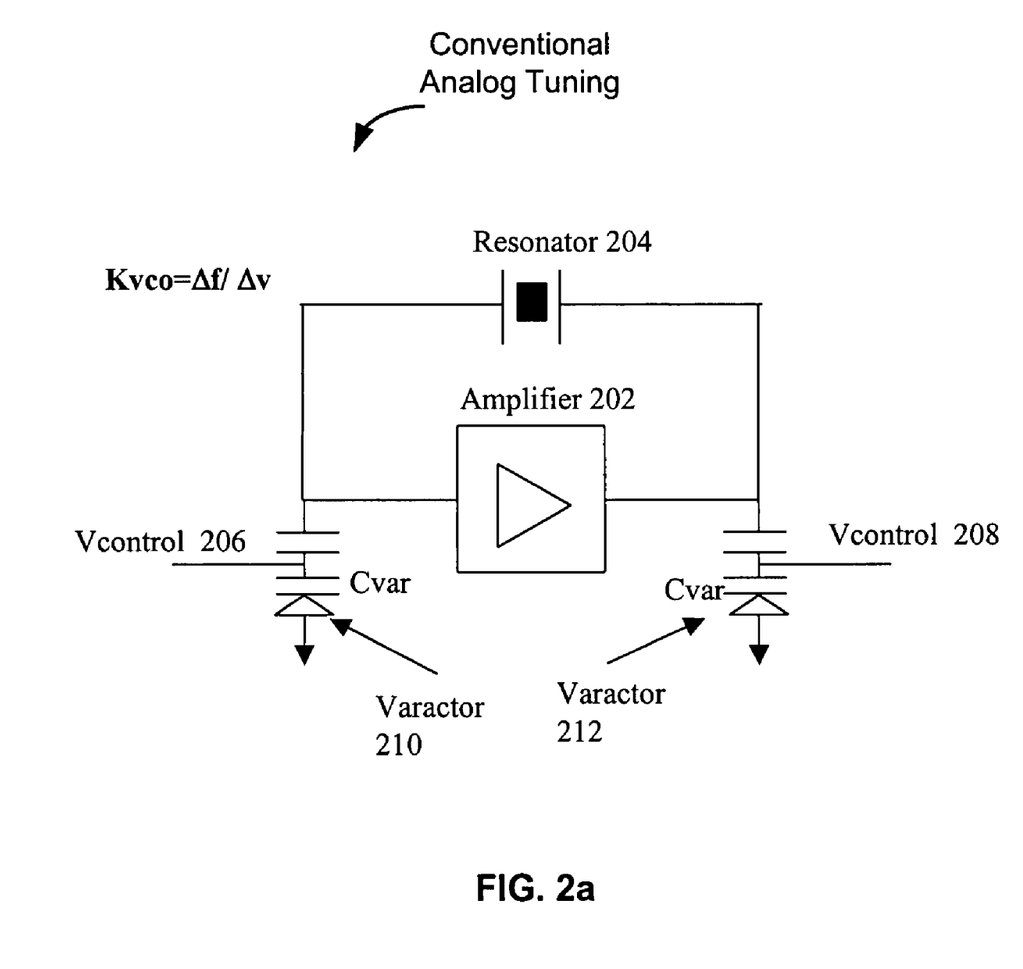
FIG. 2a is a block diagram illustrating a typical oscillator circuit using analog frequency tuning.

There are various methods to tune the frequency of a VCO. FIG. 2a illustrates a conventional analog method of tuning a VCO by using varactors. This method includes the use of a resonator 204, an amplifier 202, and two varactors 210 and 212 controlled by analog voltage controls Vcontrol 206 and Vcontrol 208, respectively. The capacitance of a varactor varies with the voltage applied across it. Therefore, the analog voltage control will change the value of the varactor capacitance, which changes the frequency of the oscillator. The tuning range of a circuit employing this analog tuning method is limited by the linear range of the varactor capacitance vs. voltage (C-V) curve, which is limited. Achieving a wide tuning range requires that the C-V transfer gain of the VCO increases, which results in higher phase noise. Also, in complementary metal oxide semiconductor (CMOS) processes, special varactors are often not available, forcing the use of MOS for the varactor, which makes the tuning voltage range even smaller.

Figure 2B:
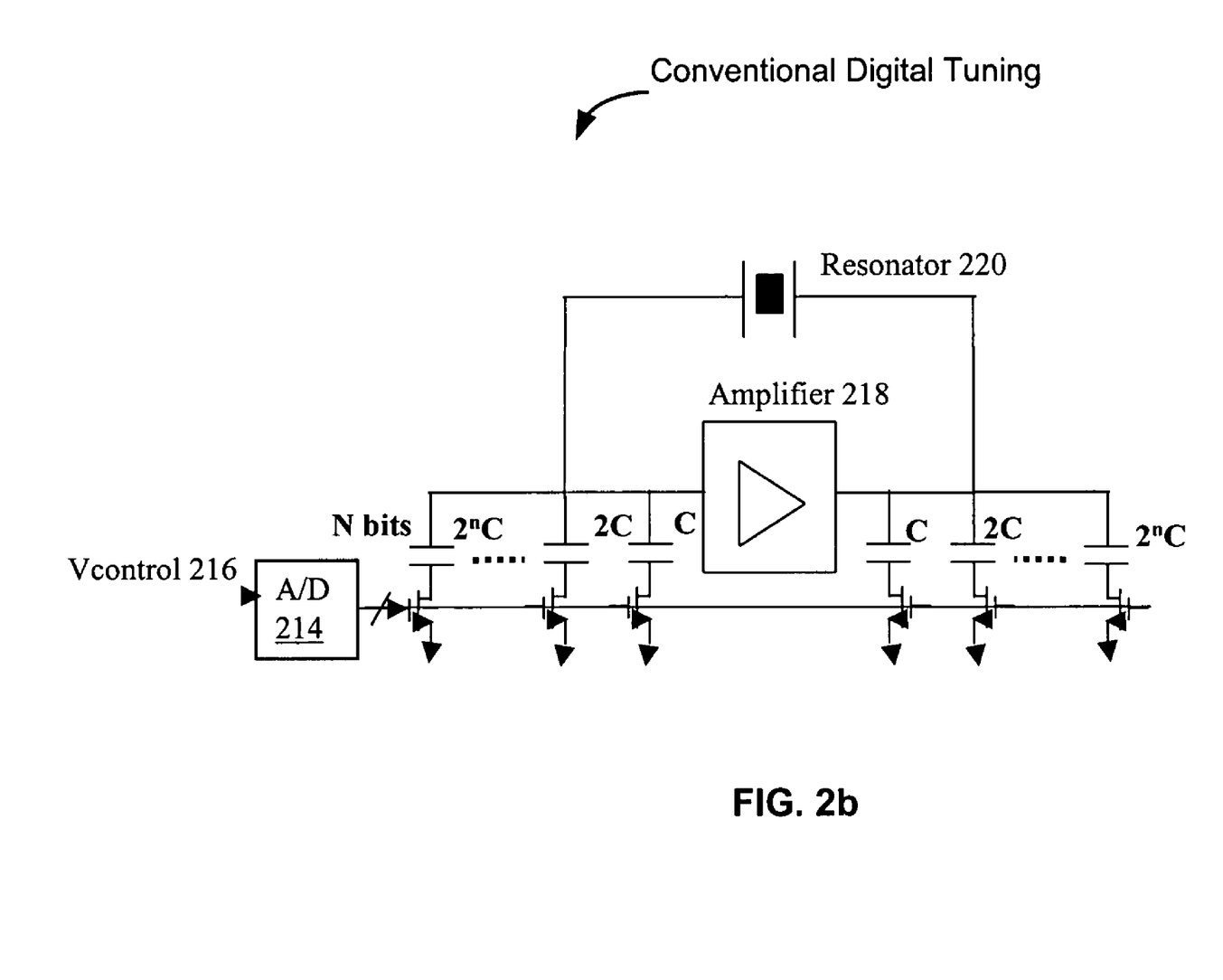
FIG. 2b is a block diagram illustrating a typical oscillator circuit using digital frequency tuning.

FIG. 2b illustrates a conventional digital method of tuning a voltage controlled oscillator using a large binary weighted capacitance array. This method includes the use of a resonator 220, an amplifier 218, an analog to digital (A/D) converter 214, and binary weighted capacitors (C, 2C, . . . , $2^nC$) controlled by a voltage control 216. This method achieves frequency tuning by converting the analog voltage signal into the digital domain using A/D converter 214 and then using the digital signals to switch in or out the binary weighted capacitors. For a wider tuning range, the resolution required for the A/D converter increases, which in turn increases the cost and complexity of the circuit. Also, for a wide tuning range, the capacitance ratio of the highest value to lowest value increases, which makes it harder to realize physically due to stray capacitances.

BRIEF DESCRIPTION OF THE DRAWINGS

The invention is illustrated by way of example, and not by way of limitation, in the figures of the accompanying drawings in which like reference numerals refer to similar elements.

DETAILED DESCRIPTION

Embodiments of a mixed signal method and system for tuning a voltage controlled oscillator are described. In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 3:
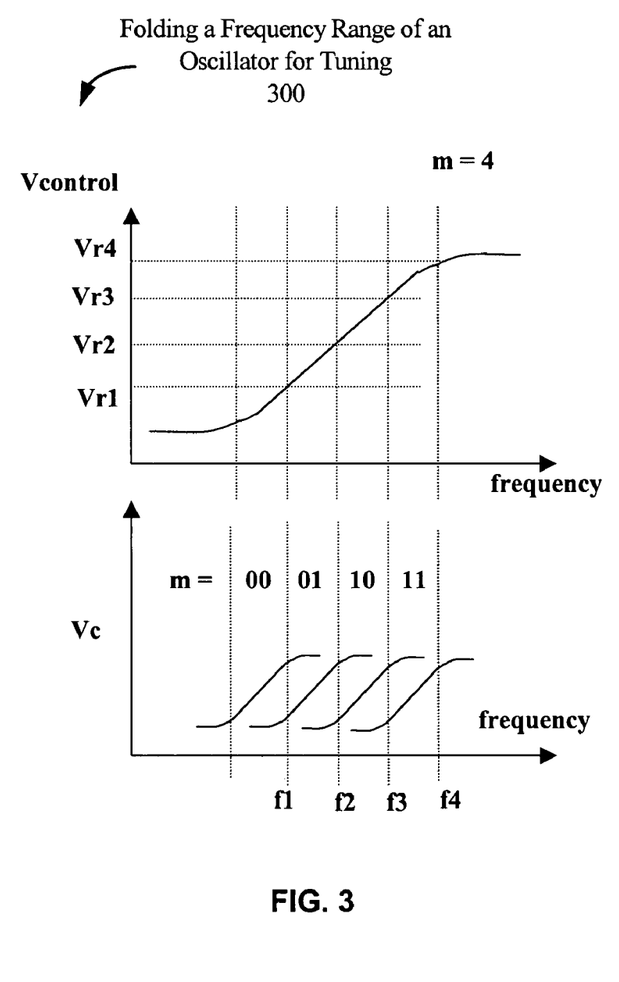
FIG. 3 is a graph illustrating a method of folding a frequency range for tuning according to an embodiment of the invention.

Referring to FIG. 3, a graph illustrates a method 300 of folding a frequency range of an oscillator for tuning according to an embodiment of the invention. As shown, the wide frequency range of an oscillator is divided into a plurality of regions for tuning. In the example of FIG. 3, the number of tuning regions (m) is four. However, other numbers of tuning regions may be used. Each of the plurality of regions is selected and tuned via a plurality of digital tuning elements. Then, further tuning of the selected region is done via a plurality of analog tuning elements.

Figure 4:
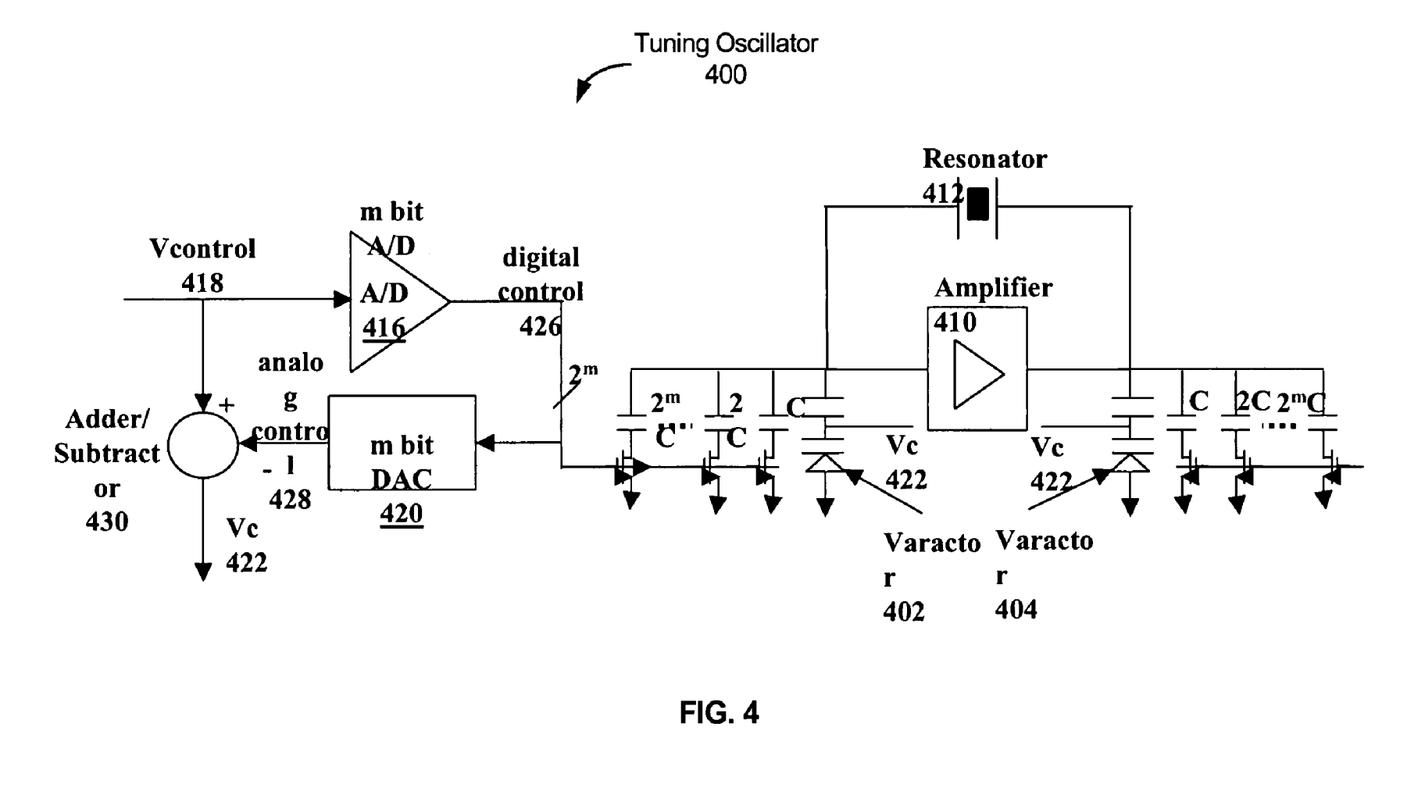
FIG. 4 is a block diagram illustrating a tuning oscillator circuit according to an embodiment of the invention.

FIG. 4 is a block diagram illustrating a tuning oscillator circuit 400 according to an embodiment of the invention. The tuning oscillator circuit 400 includes an amplifier 410 and a resonator 412. The tuning oscillator circuit 400 implements a mixed signal method of tuning a folded frequency range of the oscillator. An analog control signal, Vcontrol 418, is converted into a digital control signal 426 via analog to digital converter 416. In one embodiment, the number of bits of the digital control signal 426 is equal to the number of divided regions (m) of the frequency range of the oscillator. The digital control signal 426 is used to control a plurality of metal oxide semiconductors (MOS) capacitors (C, 2C, . . . , $2^mC$). By switching in/out the MOS capacitors, the digital control signal 426 selects the region of the divided frequency range of the oscillator to be tuned and an initial tuning of the selected region is done via the weighted capacitors. After the region of the divided frequency range of the oscillator is selected, the region is further tuned via one or more varactors, such as 402 and 404. The varactors are controlled by a voltage control signal, Vc 422. Voltage control signal 422 is obtained by converting the digital control signal 426 back to an analog signal 428 via a digital to analog converter 420 and then subtracting the analog signal 428 from the voltage control signal 418 via adder/subtractor 430.

The digital to analog converter 420 and the adder/subtractor 430 are one example of a folder circuit that may be used to obtain the voltage control signal 422. Alternatively, other types of folder circuits, such as that shown in FIG. 6, may be used in the tuning oscillator circuit 400 to obtain the voltage control signal 422. Although FIG. 4 shows the invention implemented in a Pierce type oscillator according to one embodiment, the invention may be implemented in other types of oscillator circuits including but not limited to Colpitts, Hartley, and Butler type oscillators.

Figure 5:
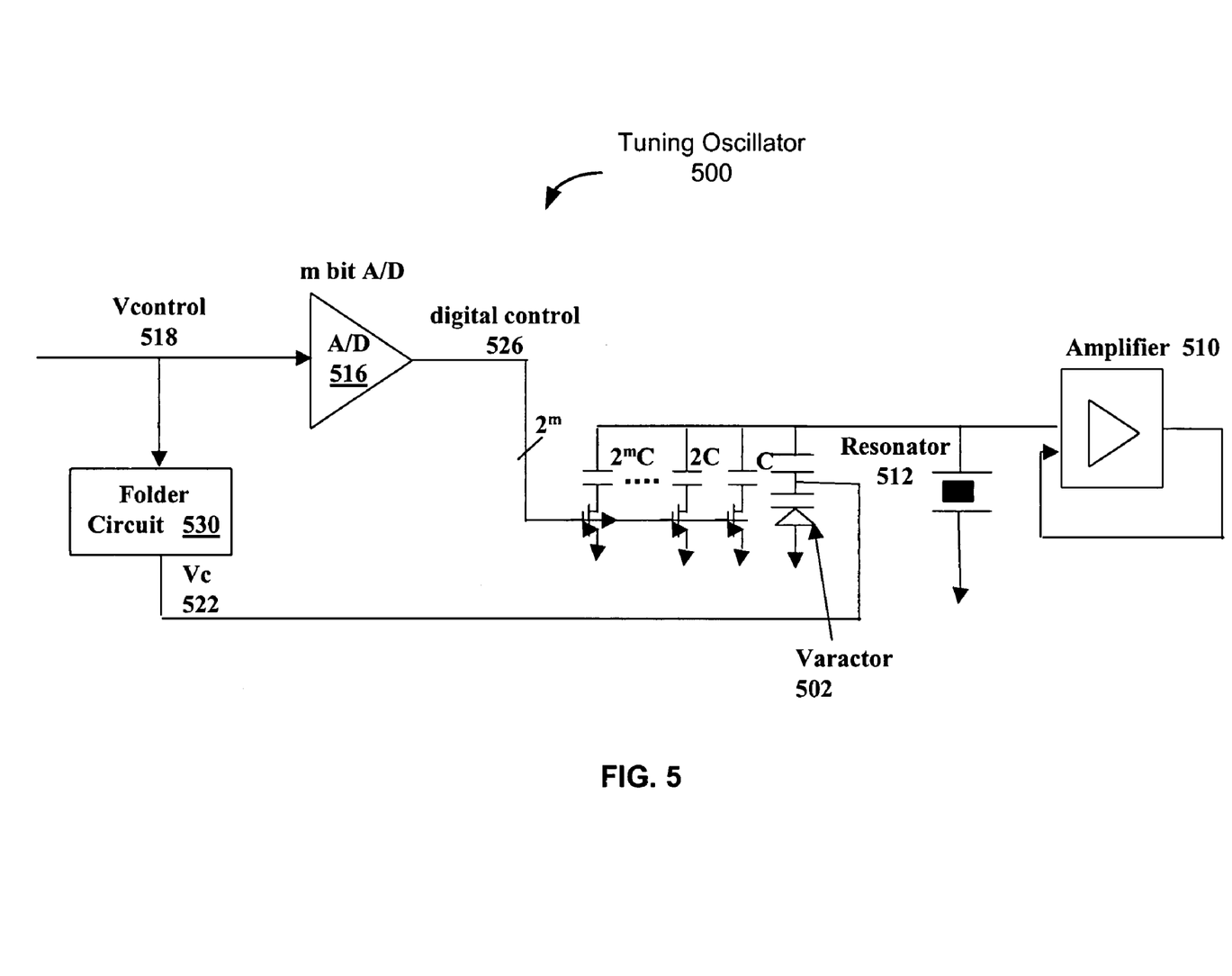
FIG. 5 is a block diagram illustrating a tuning oscillator circuit according to an embodiment of the invention.
Figure 6:
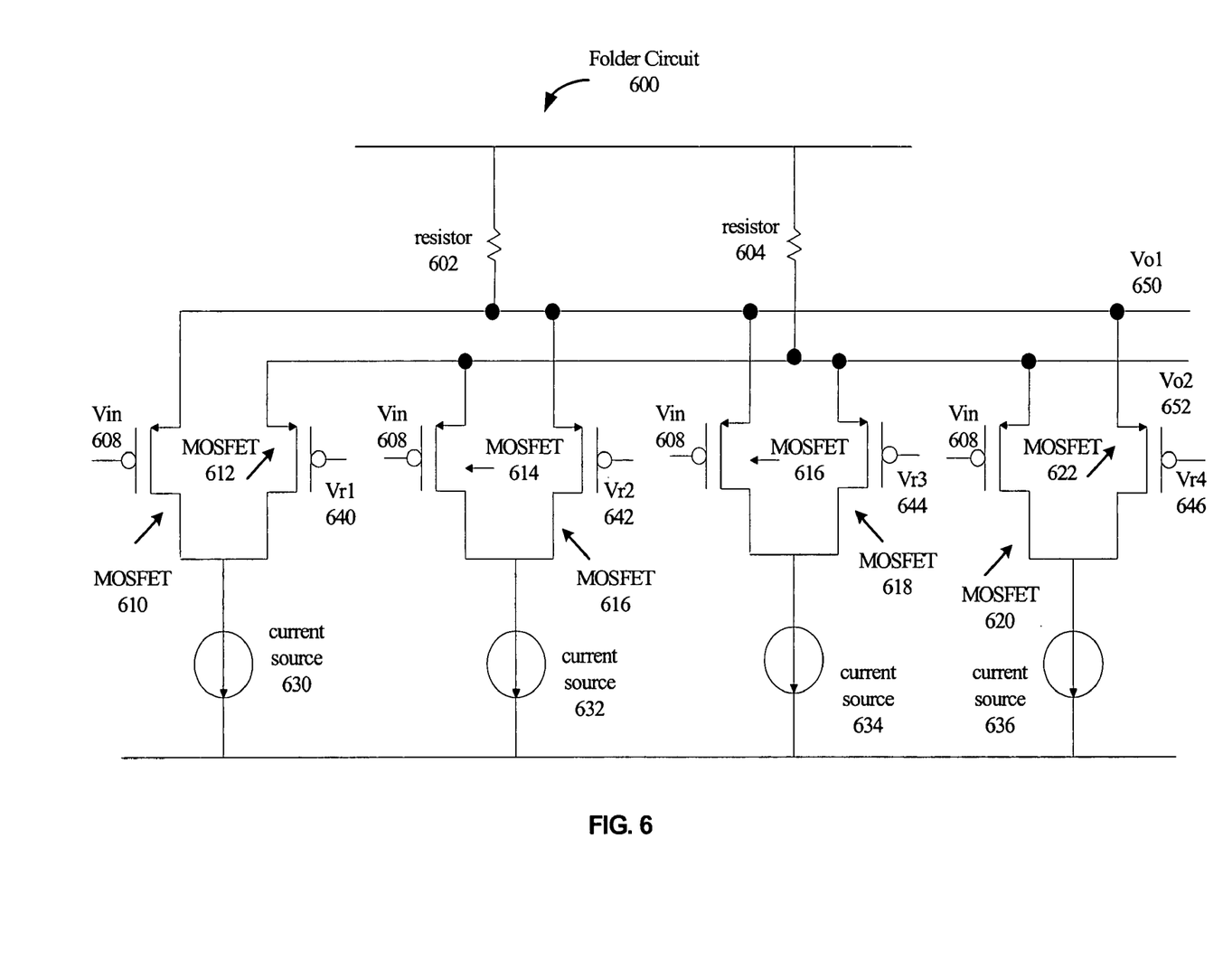
FIG. 6 is a block diagram illustrating an exemplary folder circuit.

FIG. 5 is a block diagram illustrating a tuning oscillator circuit 500 according to an embodiment of the invention. In this example, an embodiment of the invention is implemented in a one-pin oscillator. The tuning oscillator circuit 500 includes an amplifier 510, a resonator 512, a voltage control signal 518, an analog to digital converter 516 to convert the voltage control signal 518 to a digital control signal 526, and a plurality of MOS capacitors (C, 2C, . . . , $2^m$C) controlled by the digital control signal 526. By switching in/out the MOS capacitors, the digital control signal 526 selects the region of the divided frequency range of the oscillator to be tuned and an initial tuning of the selected region is done via the weighted capacitors. After the region of the divided frequency range of the oscillator is selected, the region is further tuned via varactor 502. Varactor 502 is controlled by a control signal Vc 522. Vc is the output of a folder circuit 530. The input to the folder circuit 530 is the voltage control signal 518. The folder circuit 530 may be implemented as shown in FIG. 6. Alternatively, other types of folder circuits may be used, such as the digital to analog converter and adder/subtractor shown in FIG. 4.

FIG. 6 is a block diagram illustrating an exemplary folder circuit 600. In this example, the folding factor is four. The folding factor corresponds to the number of divided frequency regions of the oscillator circuit. The folder circuit 600 includes a plurality of resistors, such as 602 and 604, a plurality of current sources, such as 630–636, and a plurality of MOS devices, such as 610–622. Each pair of MOS devices, such as 610 and 612, are controlled by an input voltage, Vin 608, and a reference or trip voltage, such as Vr1–Vr4 (640–646). The difference of the two voltage outputs 650 and 652 (Vo1 minus Vo2) may be used as the final output of the folder circuit 600. As an example, if the folder circuit 600 is implemented in the tuning oscillator circuit of FIG. 5, the input voltage Vin would be the voltage control signal, Vcontrol 518. The output of the folder circuit 600, which is equal to Vo1 minus Vo2, is the control signal Vc 522, which is used to control varactor 502. The reference voltages, Vr1–Vr4, correspond to the value of Vcontrol at the frequencies f1–f4 of the plurality of tuning regions, as illustrated in FIG. 3.

Figure 7:
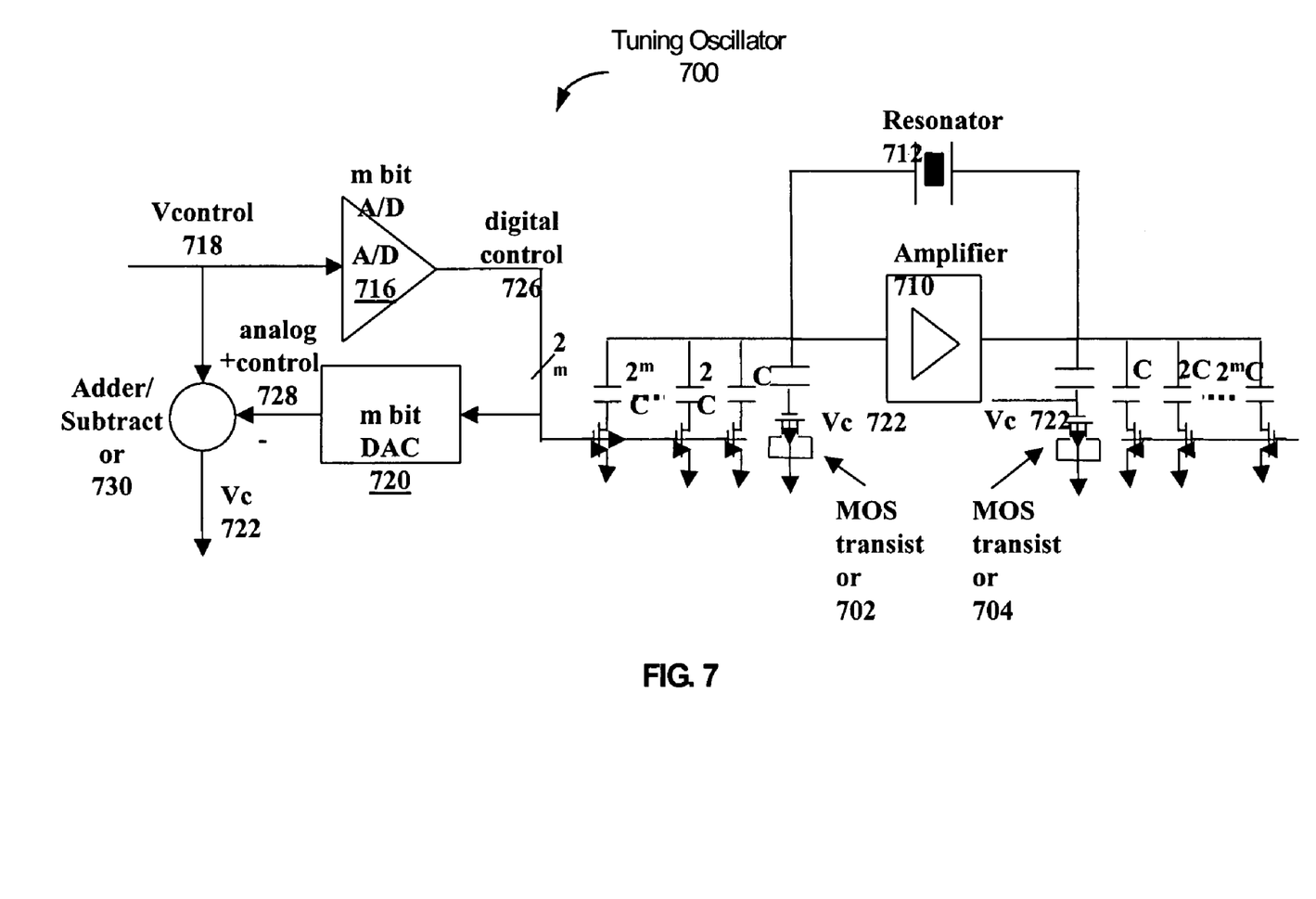
FIG. 7 is a block diagram illustrating a tuning oscillator circuit according to an embodiment of the invention.

FIG. 7 is a block diagram illustrating a tuning oscillator circuit 700 according to an embodiment of the invention. As in the circuit of FIG. 4, the tuning oscillator circuit 700 includes an amplifier 710, a resonator 712, a voltage control signal 718, an analog to digital converter 716 to convert the voltage control signal 718 to a digital control signal 726, a digital to analog converter 720 to convert the digital control signal 726 to an analog control signal 728, and an adder/subtractor 730 to calculate Vc 722, which is obtained by subtracting the analog control signal 728 from Vcontrol 718. A plurality of MOS capacitors (C, 2C, . . . , $2^m$C) are switched in/out by the digital control signal 726 to select the region of the divided frequency range of the oscillator to be tuned and to do an initial tuning of the selected region. After the region of the divided frequency range of the oscillator is selected, the region is further tuned via one or more MOS transistors, such as 702 and 704. The MOS transistors are controlled by the control signal Vc 722. The use of MOS transistors in the circuit 700 allows for temperature compensation. Since a MOS transistor is typically biased in the depletion region, temperature compensation may be achieved via the use of the temperature coefficient of the MOS capacitance of the MOS transistor.

Figure 8:
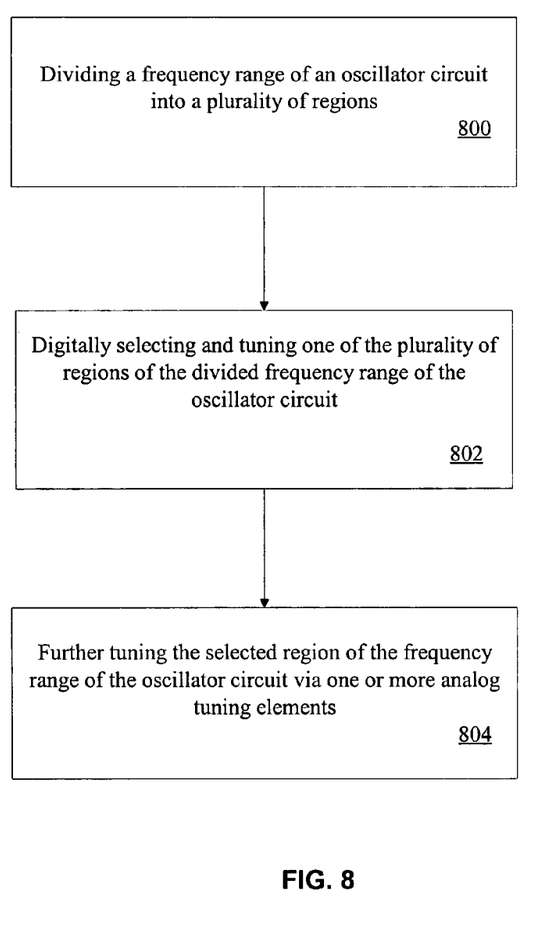
FIG. 8 is a flow diagram illustrating a method according to an embodiment of the invention.

FIG. 8 illustrates a method according to one embodiment of the invention. At 800, a frequency range of an oscillator circuit is divided into a plurality of regions for tuning. At 802, one of the plurality of regions of the divided frequency range of the oscillator circuit is selected and tuned via a plurality of digital tuning elements. In one embodiment, an analog control signal is converted into a digital control signal. The digital control signal is used to control a plurality of MOS capacitors. In one embodiment, the number of bits of the digital control signal corresponds to the number of divided frequency regions of the oscillator. At 804, the selected region of the divided frequency range of the oscillator circuit is further tuned via a plurality of analog tuning elements. In one embodiment, an analog control signal is used to control a plurality of varactors for further tuning the digitally tuned frequency. In one embodiment, an analog control signal is used to control a plurality of MOS transistors for further tuning the digitally tuned frequency.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. An oscillator circuit comprising:
   one or more digital tuning elements to tune the oscillator circuit to a selected region of a divided frequency range of the oscillator circuit;
   one or more analog tuning elements to tune the oscillator circuit within the selected region of the divided frequency range of the oscillator circuit;
   an analog-to-digital converter to convert a first analog control voltage into a digital control signal to control the one or more digital tuning elements; and
   a voltage folder circuit to convert the first analog control voltage and the digital control signal into a folded analog tuning voltage to control the one or more analog tuning elements.

2. The oscillator circuit of claim 1, wherein at least one of the one or more digital tuning elements comprises a metal oxide semiconductor (MOS) device.

3. The oscillator circuit of claim 1, wherein at least one of the one or more digital tuning elements comprises a capacitor.

4. The oscillator circuit of claim 1, wherein at least one of the one or more analog tuning elements comprises a varactor.

5. The oscillator circuit of claim 1, wherein the voltage folder circuit comprises:
   a digital to analog converter to convert the digital control signal into a second analog control voltage; and
   an adder/subtractor to subtract the second analog control voltage from the first analog control voltage to generate the folded analog tuning voltage.

6. A phase locked loop circuit comprising the oscillator circuit of claim 1.

7. The phase locked loop circuit of claim 6, further comprising a phase comparator coupled to the oscillator circuit.

8. The phase locked loop circuit of claim 7, further comprising a filter coupled to the oscillator circuit.

9. A method comprising:
   converting a first analog control voltage of an oscillator circuit into a digital control signal;
   digitally tuning the oscillator circuit to a selected region of a divided frequency range of the oscillator circuit with the digital control signal;
   converting the digital control signal and the first analog control voltage into a folded analog tuning voltage; and
   tuning within the selected region of the divided frequency range of the oscillator circuit by controlling one or more analog tuning elements with the folded analog tuning voltage.

10. The method of claim 9, wherein tuning within the selected region of the divided frequency range of the oscillator circuit by controlling one or more analog tuning elements with the folded analog tuning voltage comprises tuning within the selected region with one or more varactors.

11. The method of claim 9, wherein converting the digital control signal and the first analog control voltage into the folded analog tuning voltage comprises:
    converting the digital control signal into a second analog control voltage; and
    subtracting the second analog control voltage from the first analog control voltage.

12. The method of claim 9, wherein the digital control signal comprises a number of bits corresponding to a number of regions of the divided frequency range of the oscillator circuit.

13. The method of claim 9, wherein digitally tuning the oscillator circuit to a selected region of the divided frequency range of the oscillator circuit comprises controlling one or more metal oxide semiconductor (MOS) gates to switch one or more capacitors.

14. An apparatus comprising:
    means for converting an oscillator control voltage into a digital control signal to digitally tune the oscillator; and
    means for converting the digital control signal and the oscillator control voltage into a folded analog tuning voltage.

15. The apparatus of claim 14, further comprising means for selecting a region of a divided frequency range of the oscillator with the digital control signal.

16. The apparatus of claim 15, further comprising means for tuning within the selected region of the divided frequency range of the oscillator by with the folded analog tuning voltage.

* * * * *